United States Patent
Vail et al.

(10) Patent No.: US 9,082,700 B2
(45) Date of Patent: Jul. 14, 2015

(54) ULTRAVIOLET TREATMENT OF METAL OXIDE ELECTRODES

(75) Inventors: Sean Andrew Vail, Vancouver, WA (US); David R. Evans, Beaverton, OR (US); Wei Pan, Vancouver, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 868 days.

(21) Appl. No.: 13/296,191

(22) Filed: Nov. 14, 2011

(65) Prior Publication Data

US 2013/0122723 A1 May 16, 2013

(51) Int. Cl.
 H01L 21/44 (2006.01)
 H01L 21/268 (2006.01)
 H01G 9/20 (2006.01)
 H01L 21/02 (2006.01)
 H01L 29/786 (2006.01)

(52) U.S. Cl.
 CPC .......... *H01L 21/2686* (2013.01); *H01G 9/2031* (2013.01); *H01G 9/2059* (2013.01); *H01L 21/02554* (2013.01); *H01L 29/7869* (2013.01); *Y02E 10/542* (2013.01)

(58) Field of Classification Search
 CPC ...... B01J 35/004; B01J 19/127; B01J 21/063; H01L 29/7969; H01L 21/02554
 USPC .................. 438/608, 648, 652, 656
 See application file for complete search history.

(56) References Cited

U.S. PATENT DOCUMENTS

2009/0074611 A1* 3/2009 Monzyk et al. ................. 422/29

OTHER PUBLICATIONS

E. Galoppini, Coordination Chemistry Reviews 2004, 248, 1283-1297.
G. Caputo, C. Nobile, T. Kipp, L. Blasi, V. Grillo, E. Carlino, L. Manna, R. Cingolani, P. D. Cozzoli.
F. Hirose, K. Kuribayashi, T. Suzuki, Y. Narita, Y. Kimura and M. Niwano, Electrochemical and Solid-State Letters 2008, 11, A109-A111.
B. J. Brennan, A. E. Keirstead, P. A. Liddell, S. A. Vail, T. A. Moore, A. L. Moore and D. Gust, Nanotechnology 2009, 20, 1-10.
F. O. Lenzmann and J. M. Kroon, Advances in Optoelectronics 2007, vol. 2007, Article ID 65073, 1-10).
B. O'Regan and M. Gratzel, Nature 1991, 353, 737-740.

* cited by examiner

*Primary Examiner* — Zandra Smith
*Assistant Examiner* — John M Parker
(74) *Attorney, Agent, or Firm* — Law Office of Gerald Maliszewski; Gerald Maliszewski

(57) ABSTRACT

An ultraviolet treatment method is provided for a metal oxide electrode. A metal oxide electrode is exposed to an ultraviolet (UV) light source in a humid environment. The metal oxide electrode is then treated with a moiety having at least one anchor group, where the anchor group is a chemical group capable of promoting communication between the moiety and the metal oxide electrode. As a result, the moiety is bound to the metal oxide electrode. In one aspect the metal oxide electrode is treated with a photoactive moiety. Exposing the metal oxide electrode to the UV light source in the humid environment induces surface defects in the metal oxide electrode in the form of oxygen vacancies. In response to the humidity, atmospheric water competes favorably with oxygen for dissociative adsorption on the metal oxide electrode surface, and hydroxylation of the metal oxide electrode surface is induced.

17 Claims, 7 Drawing Sheets

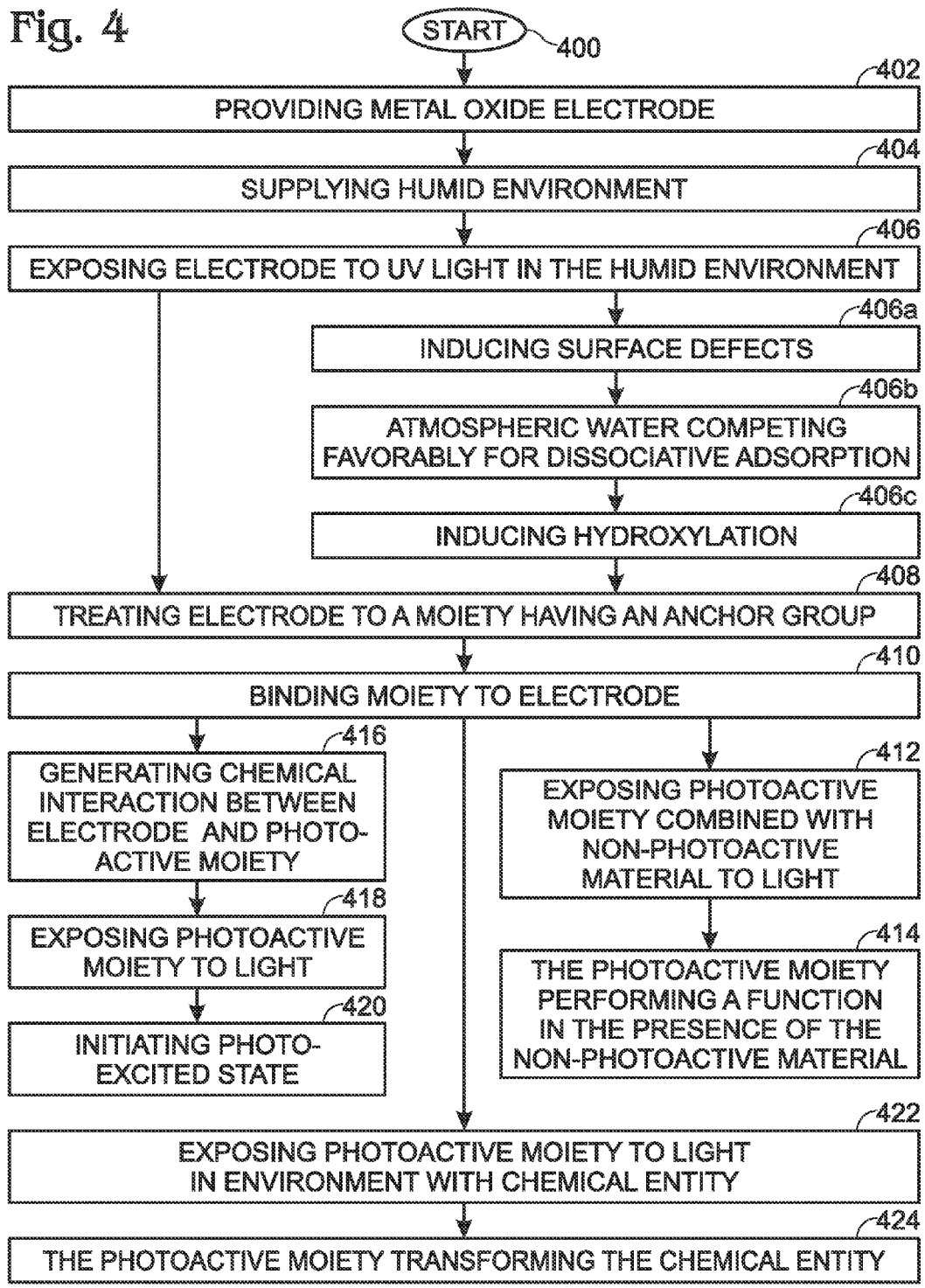

ULTRAVIOLET TREATMENT OF METAL OXIDE ELECTRODES

BACKGROUND OF THE INVENTION

1. Field of the Invention

This invention generally relates to dye-sensitive chemistry and, more particularly, to an ultraviolet (UV) process for the treatment of metal oxide electrodes.

2. Description of the Related Art

Dye-sensitized solar cells (DSCs) offer the potential to provide a practical and economically viable alternative to p-n junction photovoltaic devices. In conventional silicon systems, the semiconductor assumes the roles of both light absorption and charge carrier transport. In contrast, the two functions are effectively separated in DSCs whereby light is absorbed by a sensitizer that is anchored to the surface of a wide band gap oxide semiconductor. In this scenario, charge separation takes place at the interface via photo-induced electron injection from the dye into the conduction band of the solid. Subsequently, carriers are transported in the conduction band of the semiconductor to the charge collector. A large fraction of incident light can be effectively harvested through the integration of photosensitizers exhibiting broad absorption bands in conjunction with oxide films of nanocrystalline morphology. With the appropriate photosensitizer, it is possible to achieve nearly quantitative conversion of incident photons into electric current over wide spectral regions.

In general, conventional DSCs consist of similar architectural components. The first is a transparent anode composed of fluoride-doped tin dioxide ($SnO_2$:F) or similar deposited on a glass plate. On top of the $SnO_2$:F is deposited a thin layer of titanium dioxide ($TiO_2$), which provides a porous structure with extremely high surface area. Conventionally, the $TiO_2$ is nanoparticulate although other morphologies are possible. The plate is then immersed in a solution containing a photosensitive dye dissolved in a nonaqueous solvent. After removing the plate from the photosynthesizer (dye) solution, a thin layer of the dye molecules (monolayer) is effectively anchored to the surface of the $TiO_2$ film. Next, the conductive plate containing the dye-soaked $TiO_2$ film is assembled into a functional DSC device. Although the sequence and manner through which the final steps of fabrication proceed may vary, a metal (platinum) plate (cathode) is brought into contact with the $TiO_2$ film, which is normally accomplished using a thermoplastic spacer. Injection of electrolyte and subsequent sealing of the injection and exit ports completes the cell. Of course, variations in DSC architectures and/or specific methods for their fabrication are possible, although this introduction is limited to the traditional DSC configuration using a solvent-based ($I^-/I_3^-$) electrolyte.

FIG. 14 is a schematic depicting the operative principles of a DSC device (prior art). Absorption of light by the photosensitizer (S) attached to $TiO_2$ generates an electronically excited state (S*) from which electron injection into the conduction band of $TiO_2$ proceeds. The electrons are subsequently transported through the $TiO_2$ film by diffusion before reaching the anode of the cell (typically an $SnO_2$:F coated glass substrate) and the external circuit (2). The positive charges resulting from the electron transfer (injection) process from the photoexcited sensitizer (S*) are transferred to a liquid electrolyte by reaction of the photosensitizer (S+) with the reduced species of the iodine redox couple ($I^-$) in the electrolyte matrix, which leads to effective regeneration of the photosensitizer ground (S) state (3). Next, the positive charge carrier ($I_3^-$) migrates to the cathode to be reduced back to $I^-$ by an electron flowing through the external circuit (4). Typically, process (4) requires a catalytic amount of Pt on the cathode surface. Overall, the process control is governed by kinetic competition. For optimized systems, potential loss mechanisms arising from deactivation of photo-excited states (sensitizer), as well as other recombination processes, are largely suppressed through a favorable kinetic balance. Overall, the generation of electrical power from light proceeds in a completely regenerative fashion such that there exists no net change in the chemical composition of the cell.

Although DSC has the potential to provide solar power as a clean, affordable and sustainable technology, many challenges continue to persist. In general, DSCs can potentially provide efficiencies comparable to a variety of thin-film technologies with the added advantage of reduced cost in terms of both materials and processing. Since the advent of DSC technology originally reported by O'Regan and Grätzel in 1991, (B. O'Regan and M. Grätzel, *Nature* 1991, 353, 737-740) a tremendous effort has been dedicated towards the realization of DSC devices with increasingly higher efficiencies.

Despite the current record efficiencies, most photosensitizers suffer from a severe deficiency in optical absorption at long wavelengths (>700 nm). Furthermore, the choice of photosensitizer is typically limited to either those with broad yet weak absorbance (low molar absorptivity) or others that absorb strongly (high molar absorptivity) over only a narrow wavelength range. In either case, a considerable fraction of the incident sunlight fails to be effectively harvested. Currently, one of the major limitations towards the realization of more highly efficient DSCs exists in the inability to construct a cell with an appropriate photosensitizer that absorbs strongly over broad spectral ranges within a reasonably thin absorbing layer.

FIG. 1 is a diagram summarizing possible modes for binding carboxylic acid group to $TiO_2$ (prior art). In general, two of the most effective anchoring groups for attaching photosensitizer molecules to metal oxide surfaces in dye sensitized solar cells are phosphonic acids [$PO(OH)_2$] followed by carboxylic acids [COOH] which also include their corresponding carboxylate salt, ester, acyl chloride and amide derivatives. In the case of carboxylic acids, efficient binding arises from reactions with hydroxyl groups along the surface although other forms of adsorption are also possible. Binding via both phosphonates and carboxylates is a reversible process although carboxylate binding for ruthenium polypyridyl complexes proceeds with an appreciable equilibrium constant ($\sim 10^5$ $M^{-1}$). With respect to photosensitizer adsorption on $TiO_2$ via carboxylic acid groups, a number of binding modes are possible which are based upon parameters related to both the structure of the dye and experimental conditions, among other factors. Although it is extremely difficult to propose a universal model for carboxylate binding, the most plausible modes include bidentate chelation and/or bidentate bridging, although multiple possibilities are likely to be simultaneously involved.

FIG. 2 is a mechanistic summary of light-induced hydroxylation along the surface of $TiO_2$ (prior art). The reversible, photo-induced hydroxylation of $TiO_2$ has previously been shown to occur upon exposure to ultraviolet light under ambient conditions, see G. Caputo, C. Nobile, T. Kipp, L. Blasi, V. Grillo, E. Carlino, L. Manna, R. Cingolani, P. D. Cozzoli and A. Athanassiou, *J. Phys. Chem. C* 2008, 112, 701-714. In this study, thin-film coatings of surfactant-capped $TiO_2$ (anatase) nanorods were oriented laterally along substrates. The evidence for the photo-generation of surface hydroxyl groups on $TiO_2$ was provided through a significant change in water contact angle (CA) following ultraviolet (UV) irradiation (CA ~20°) relative to the untreated samples (~110°), which is indicative of a large increase in surface polarity (wettability) for the irradiated $TiO_2$ sample. Furthermore, the reversibility of the phenomena was confirmed by FTIR through the evolution of hydroxyls (upon irradiation) and subsequent disappearance over time during prolonged storage in the dark under ambient conditions. These observations are indeed consistent with the idea that band-gap photo-excitation induces surface defects in the form of oxygen vacancies which allow atmospheric water to compete favorably with $O_2$ for dissociative adsorption, as indicated in FIG. 2.

FIG. 3 is a graph depicting photocurrent density-voltage curves obtained from dye-sensitized solar cells with and without the UV-treated $TiO_2$ electrodes (prior art). The enhanced performance of DSC involving ultraviolet pretreatment of $TiO_2$ with N719 dye as photosensitizer has been briefly described by F. Hirose, K. Kuribayashi, T. Suzuki, Y. Narita, Y. Kimura and M. Niwano, *Electrochemical and Solid-State Letters* 2008, 11, A109-A111. Their investigation of dye adsorption using infrared absorption spectroscopy in combination with multiple internal reflection techniques revealed the dissociative adsorption of N719 dye onto hydroxyl groups along the $TiO_2$ surface. Overall, the enhancement was quantified in terms of photocurrent densities that were determined to be 2.27 and 1.77 mA/cm² for the UV-treated and untreated $TiO_2$ electrodes. Although photocurrent increases were indeed demonstrated following UV irradiation of $TiO_2$, the phenomena is not explicitly correlated with an increase in optical density for the adsorbed (N719) photosensitizer. Furthermore, the study was limited to a single photosensitizer (N719 dye). The UV treatment was done by exposing the surface to UV light with a power of 50 μW/cm² for 10 min. The photovoltaic performance was measured under visible light intensity of 17 mW/cm².

It would be advantageous if a UV treatment could make $TiO_2$, and other types of metal oxide electrodes, more sensitive to chemical moiety binding processes.

SUMMARY OF THE INVENTION

In light of the above-mentioned observations, the advantageous exploitation of light-induced surface transition(s) of $TiO_2$ has been investigated for the purposes of increasing the number of "active" sites for photosensitizer binding, thereby ultimately increasing DSC performance through an increase in optical density for the adsorbed photosensitizer. An enhancement in optical density for photosensitizers adsorbed on transparent $TiO_2$ has successfully been demonstrated for three representatives of 2 classes of photosensitizers (porphyrin and ruthenium polyyridyl) through photoinduced hydroxylation along the $TiO_2$ surface using an ultraviolet treatment under ambient conditions. In one set of experiments, percent increases in optical density for an adsorbed zinc tetra(carboxyphenyl) porphyrin on UV-treated $TiO_2$ electrodes (relative to untreated $TiO_2$) corresponding to 3%, 5%, 14% and 21% (after 30 minutes) and 13%, 20%, 20% and 18% (after 60 minutes) for the porphyrin Q-bands were observed. In another set of experiments, percent increases in optical density for adsorbed ruthenium polypyridyl (N3) dye on UV-treated $TiO_2$ electrodes (relative to untreated $TiO_2$) corresponding to 15%, 25% and 20% (after 30 minutes) and 12%, 26% and 22% (after 60 minutes) for $\lambda1_{max}$, $\lambda2_{max}$ and $\lambda_{min}$ were achieved.

Since one goal is the enhancement of photovoltaic performance through increased photocurrent as a consequence of increased optical density of the adsorbed photosensitizer, a pair of functional DSC prototypes [UV-treated and untreated (control) transparent $TiO_2$ electrodes, thermoplastic spacer, iodine ($I^-/I_3^-$)-liquid electrolyte and platinum counter electrode) with N3 dye as photosensitizer were fabricated. According to the quantum efficiency (QE) measurements, a maximum QE of 46.1% (530 nm) and $J_{sc}$ of 6.75 mA/cm² were observed for (untreated) $TiO_2$ with adsorbed N3 dye. On the other hand, dramatic increases for both QE (68.3% at 530 nm) and $J_{sc}$ (10.68 mA/cm²)) were observed for N3-$TiO_2$ (UV-60), both of which are attributed to significant increases in optical denisty arising from the UV treatment (for 60 minutes) of $TiO_2$ prior to photosensitizer adsorption. Noteworthy is the fact that the observed enhancements correspond to significant percent increases for N3 dye adsorbed on the UV-treated $TiO_2$ electrode (with respect to an untreated $TiO_2$ electrode) in terms of both QE (+48%) and $J_{sc}$ (+58%).

In general, the experimental parameters have been all but optimized for maximizing the optical density of the porphyrin and ruthenium-based dyes on UV-treated $TiO_2$ electrodes. In the case of N3 dye, optical densities have been achieved on $TiO_2$ that exceed those of the sample used to produce an initial high-performance prototype. The technology/invention utilizes ultraviolet light (365 nm) under ambient conditions in the presence of oxygen, atmospheric humidity (~40%) and requires no special operating conditions. Furthermore, it is conceivable that equivalent enhancements in optical density/ photovoltaic performance can be achieved at shorter time intervals and/or lower power levels of UV exposure using the appropriate lighting source(s).

Accordingly, an ultraviolet treatment method is provided for a metal oxide electrode. A metal oxide electrode is provided. The metal oxide electrode is exposed to an ultraviolet (UV) light source in a humid environment. The metal oxide electrode is then treated with a moiety having at least one anchor group, where the anchor group is a chemical group capable of promoting communication between the moiety and the metal oxide electrode. As a result, the moiety is bound to the metal oxide electrode. In one aspect the metal oxide electrode is treated with a photoactive moiety.

More explicitly, exposing the metal oxide electrode to the UV light source in the humid environment includes inducing surface defects in the metal oxide electrode in the form of oxygen vacancies in response to the UV light. In response to the humidity, atmospheric water competes favorably with oxygen for dissociative adsorption on the metal oxide electrode surface, and hydroxylation of the metal oxide electrode surface is induced. As a result, at least one anchor group of the photoactive moiety is bound to a hydroxyl group of the metal oxide electrode.

Additional details of the above-described method are provided below.

BRIEF DESCRIPTION OF THE DRAWINGS

FIG. 4 is a flowchart illustrating an ultraviolet treatment method for a metal oxide electrode.

DETAILED DESCRIPTION

Figure 1:
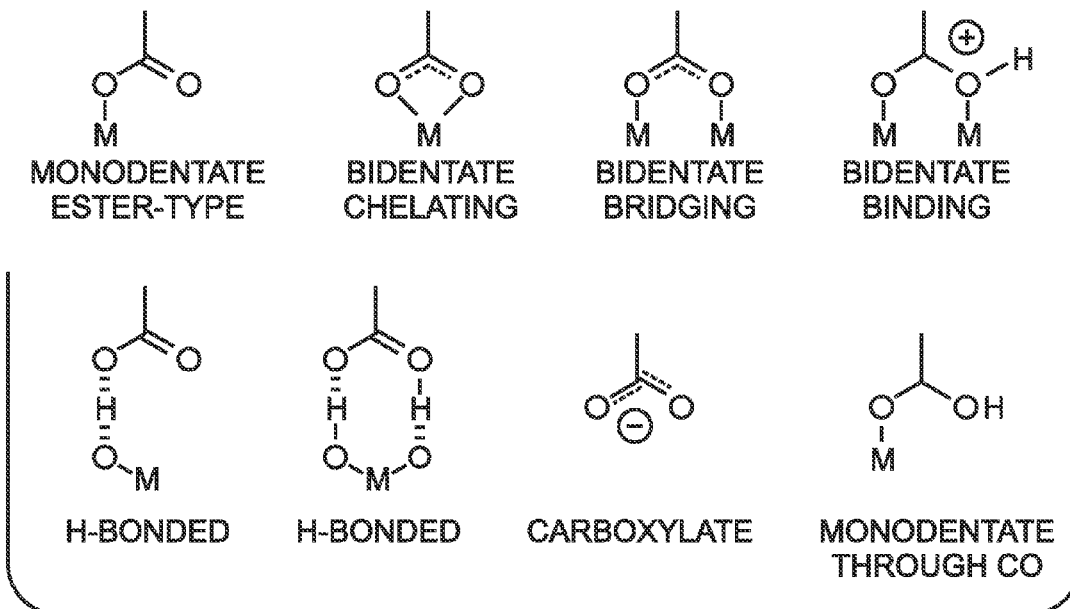
FIG. 1 is a diagram summarizing possible modes for binding carboxylic acid group to $TiO_2$ (prior art).
Figure 2:
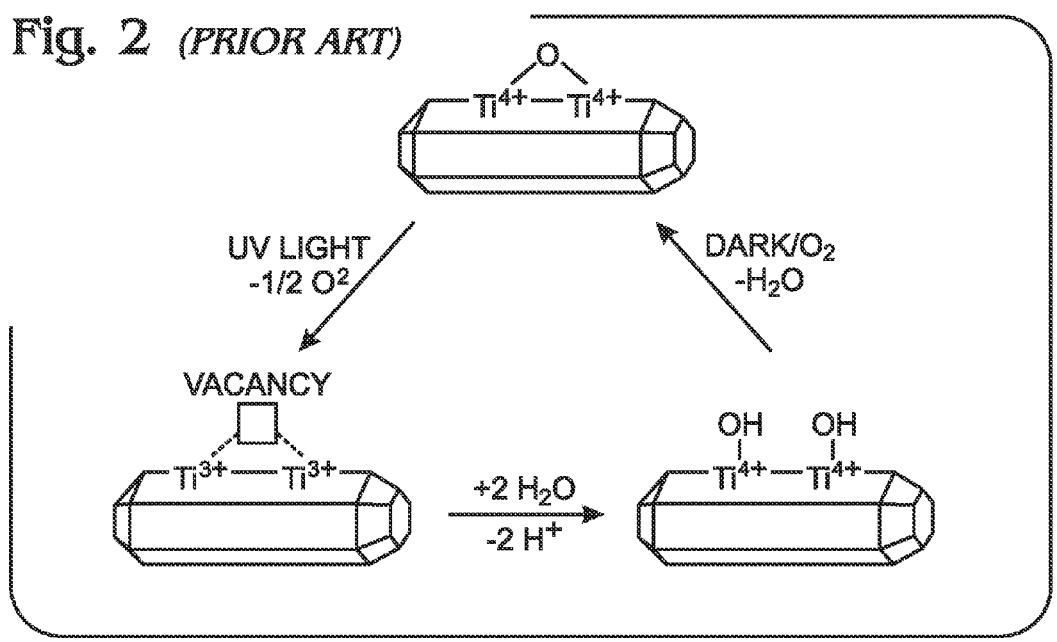
FIG. 2 is a mechanistic summary of light-induced hydroxylation along the surface of $TiO_2$ (prior art).
Figure 3:
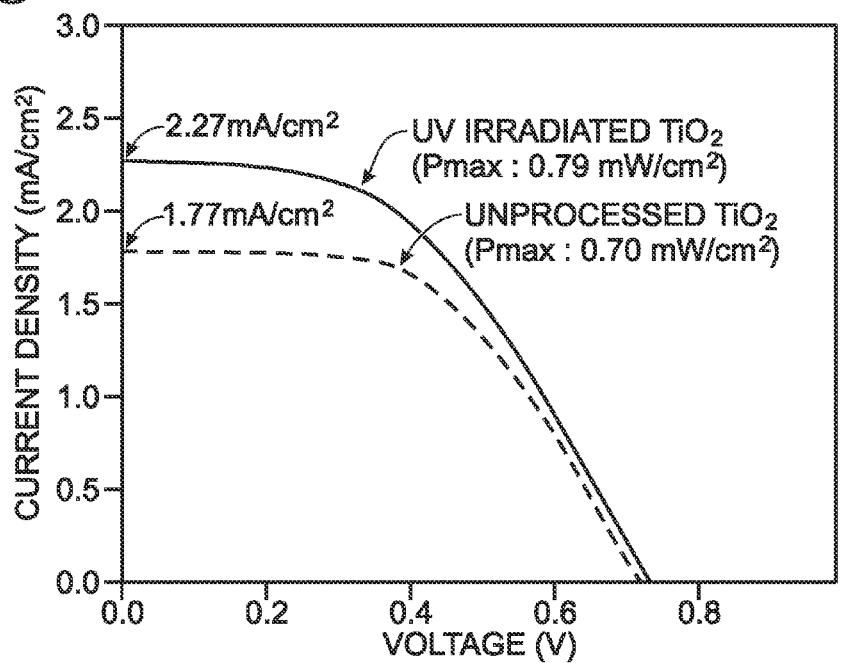
FIG. 3 is a graph depicting photocurrent density-voltage curves obtained from dye-sensitized solar cells with and without the UV-treated $TiO_2$ electrodes (prior art).

Described below are methods for advantageously exploiting the light-induced surface transition(s) of TiO$_2$ for the purposes of increasing the number of "active" sites for photosensitizer binding, thereby ultimately increasing DSC performance through an increase in optical density for the adsorbed photosensitizer. Since the overall efficiency (η) of a DSC is a product of the short-circuit current density ($J_{sc}$), the open-circuit photovoltage ($V_{oc}$) and fill-factor (FF), as indicated by the equation below, an increase in any of these parameters necessarily leads to improved overall performance.

$$\eta = \frac{J_{sc} \times V_{oc} \times FF}{P_{in}}$$

whereby $P_{in}$ is the total incident solar power.

In particular, $J_{sc}$, which can be simplified to be a measure of the ability of an absorber molecule (photosensitizer) to harvest light, appears to be the most straightforward approach towards increasing performance. Assuming the photo-generation of more active binding sites (via UV-induced hydroxylation) leads to either (1) an increase in the number of adsorbed photosensitizer molecules per unit area (increased optical density) relative to the untreated TiO$_2$ surface, (2) more favorable communication between the photosensitizer and TiO$_2$ due to a prevalence of electronically favorable binding modes or (3) contributions from both (1) and (2), then $J_{sc}$ (and thus efficiency) enhancements would indeed be expected.

Whereas previous studies have been limited to a single photosensitizer (N719 dye), significant increases in optical densities for 2 different porphyrins and a ruthenium polypyridyl (N3 dye), as well as photocurrent (N3 dye) for photosenstizers adsorbed on UV-irradiated TiO$_2$ electrodes are described herein. It is believed that this phenomenon has not been previously observed for the porphyrin class of photosensitizers. Finally, the performance of the initial solar cell prototype (N3 dye) greatly exceeds that described in previous studies and can be attributed to the optimized process parameters, which is described in detail below Finally, in addition to carboxylic acid anchoring groups (or alternatives such as phosphonic and sulfonic acids), the method described herein can be extended in a straightforward fashion to additional anchoring moieties such as silanes. In general, alkoxysilanes (silatranes, chlorosilanes, etc.) readily form exceptionally stable silyl ether (covalent) bonds through reactions with hydroxyl groups and therefore demonstrate an increased resistance to desorption phenomena relative to carboxylic, phosphonic and sulfonic acids. The photo-generation of surface hydroxyl groups on TiO$_2$ undoubtedly leads to an increased abundance of reactive sites for effective (covalent) attachment of reactive alkoxysilanes, silatranes, etc. Although a higher degree of attachment to TiO$_2$ is reasonably expected for the entire class of alkoxysilanes and derivatives, the brief discussion provided is limited to the potential value of the invention as it pertains to silane-derivatized photosensitizers in the context of DSCs. Gust and co-workers (B. J. Brennan, A. E. Keirstead, P. A. Liddell, S. A. Vail, T. A. Moore, A. L. Moore and D. Gust, *Nanotechnology* 2009, 20, 1-10.) introduced a terminal 1-(3'-amino)propylsilane into porphyrin and ruthenium-based photosensitizers in order to achieve strong attachment to transparent semiconductor nanoparticulate metal oxide films for the construction of photoelectrochemical cells. Overall, the porphyrin-silatrane photosensitizers exhibited similar (or better) performance than the carboxylate analogs, which was attributed to slower charge recombination between the oxidized porphyrin and the electrode surface due to the longer linker of the porphyrin-silatrane derivatives. Certainly, the ability to increase the optical density of photosensitizers attached to metal oxides through stable linkages (silyl ether) using the UV-induced hydroxylation of TiO$_2$ described herein offers the potential to produce highly-efficient DSCs with excellent long-term durability. As previously mentioned, the application of the technology to silanes is simply an additional yet reasonable extension of the advantages provided by this method.

FIG. 4 is a flowchart illustrating an ultraviolet treatment method for a metal oxide electrode. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 400.

Step 402 provides a metal oxide electrode. Some examples of metal oxide electrode materials include metal and mixed-metal oxides of titanium, silicon, magnesium, calcium, strontium, barium, scandium, yttrium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, mercury, aluminum, gallium, indium, germanium, tin, lead, antimony, and bismuth. The metal oxide electrode may have an amorphous or crystalline morphology, or a morphology representative of both amorphous and crystalline. The metal oxide electrode may have an architecture that is planar, particles, nanoparticles, wires, nanowires, tubes, nanotubes, cones, nanocones, rods, nanorods, pillars, nanopillars, mesoporous, geometric shapes in two-dimensional (2D) and 3D arrays, or combinations thereof. Further, the metal oxide electrode may be blended with a conducting species of elemental carbon, graphene, carbon nanotubes, fullerenes, or combinations thereof.

Step 404 supplies a humid environment. In one aspect, the humidity level of at least 30%. In the humid environment, Step 406 exposes the metal oxide electrode to an ultraviolet (UV) light source. In one aspect, Step 406 exposes the metal oxide electrode to a UV light source with a wavelength in a range between 350 and 385 nanometers (nm). However, it should be understood that the method is not limited to any particular humidity level or UV wavelength.

Step 408 treats the metal oxide electrode with a moiety having at least one anchor group, where the anchor group is a chemical group capable of promoting communication between the moiety and the metal oxide electrode. Generally, the moiety may be an electrically conductive moiety that is photoactive, an electrically conductive moiety that is not photoactive, a thermally conductive moiety that is photoactive, a thermally conductive moiety that is not photoactive, or a moiety that is not photoactive, electrically conductive, or thermally conductive. In one aspect, Step 408 simultaneously treats the metal oxide electrode with a plurality of moieties. In another aspect, Step 408 sequentially treats the metal oxide electrode with a plurality of moieties. Step 410 binds the moiety to the metal oxide electrode.

In one aspect, Step 408 treats the metal oxide electrode with a photoactive moiety, whereby exposure to light initiates a photoexcited state in the photoactive moiety from which a photo-reactive process occurs. The photoactive moiety may be a photochromatic material. Some examples of a photo-reactive process include electron injection, electron transfer, multi-electron transfer, energy-transfer, oxidation, reduction, free radical generation, complex formation, complex dissociation, ligand exchange, conformational change, isomerization, generation of subsequent excited-states, modes of deactivation for an excited-state of a photoactive moiety, and combinations of the above-listed processes.

In another aspect, exposing the metal oxide electrode to the UV light source in the humid environment in Step 406 includes substeps. In response to the UV light, Step 406a induces surface defects in the metal oxide electrode in the form of oxygen vacancies. That is, a larger population of oxygen vacancies is generated relative to a control sample not exposed to the UV light source and humid environment. In response to the humidity, in Step 406b atmospheric water competes favorably with oxygen for dissociative adsorption on the metal oxide electrode surface. Step 406c induces hydroxylation of the metal oxide electrode surface. Then, binding the photoactive moiety to the metal oxide electrode in Step 410 includes binding at least one anchor group of the photoactive moiety to a hydroxyl group of the metal oxide electrode.

Further, the method may additionally comprise Step 416 of generating a chemical interaction between the metal oxide electrode surface and the photoactive moiety in response to the OH group binding. Subsequent to binding the photoactive moiety to the metal oxide electrode, Step 418 exposes the photoactive moiety to light. In response to absorbing the light, Step 420 initiates a photoexcited state in the photoactive moiety. The actual device "function" is a consequence of an interaction between the moiety (photoactive or other) and the metal oxide. Simply put-interaction between moiety and metal oxide are equal to some device function. The term "interaction" is used since there are many modes through which this can occur. For example (in DSC), only those dye molecules attached (or interacting) with $TiO_2$ will effectively produce photocurrent following irradiation. In other words, interaction can be a type of "binding".

In this aspect, Step 408 may include treating with a photoactive moiety that is organic, inorganic, metallic, and combinations thereof including monomers, oligomers, polymers, macromolecular complexes, quantum dots, or inorganic/metallic nanoparticles.

In another aspect, Step 408 treats the metal oxide electrode with the photoactive moiety combined with a separate non-photoactive material. These treatments may be performed simultaneously or sequentially. Then, subsequent to binding the photoactive moiety to the metal oxide electrode in Step 410, Step 412 exposes the photoactive moiety to light. In response to absorbing the light, in Step 414 the photoactive moiety performs a function in the presence of the non-photoactive material. For example, the utilization of an optically inactive coadsorber [deoxycholic acid (DCA), 4-guanidinobutyric acid (GBA) or bis-(3,3-dimethylbutyl)-phosphinic acid (DINHOP)] in combination with photosensitizer dyes offers a viable strategy for increasing the overall performance of dye-sensitized solar cells. Although the co-adsorbed moiety provides no direct photoelectrochemical contribution per se, it can indirectly contribute to improvements in Jsc and Voc, and therefore overall efficiency, through the mechanisms described below. Firstly, the co-adsorber may function to suppress the tendency of photosensitizer molecules to aggregate, both in the dye solution and following adsorption along the $TiO_2$ surface. In general, interactions arising from aggregate formation lead to effective annihilation of photosensitizer excited states so that the efficiency for electron injection to $TiO_2$ following photoexcitation is reduced. Secondly, the co-adsorber tends to occupy those sites along the $TiO_2$ surface that have not been occupied by photosensitizer molecules. By filling the vacancies between photosensitizer moieties, the co-adsorber suppresses the likelihood that electrons injected in $TiO_2$ can be intercepted by the electrolyte through effective surface "shielding". Finally, it has been demonstrated that some co-adsorbers can directly improve Voc by introducing an upward shift of the $TiO_2$ conduction band edge towards more negative electrochemical potentials. One or more of the above consequences of co-adsorption can be responsible for improvements in DSC performance.

In a different aspect, subsequent to binding the photoactive moiety to the metal oxide electrode in Step 410, Step 422 exposes the photoactive moiety to light in an environment including a chemical entity in close proximity to the photoactive moiety, where close proximity is defined as a distance at which a photoactive can interact with the chemical entity. In response to absorbing the light, in Step 424 the photoactive moiety transforms the chemical entity. A general example is a metal-oxide anchored photocatalyst for an application such as solar fuel generation. In this scenario, the photocatalyst is in close proximity to liquid, gaseous (and/or solid) fuel/energy precursor materials. Following photoexcitation, the photocatalyst transforms the precursor to useful fuel/energy materials which can be subsequently harvested by any number of methods.

With respect to Step 410, ultimately the UV-induced hydroxylation generates OH groups along the metal oxide surface. The OH groups are essentially active "binding sites" for photoactive moieties. In turn, this "binding" between the hydroxylated surface and the photoactive moiety(ies) can proceed through a number of ways (or modes) and be "true" covalent (chemical) bonding, chelation (or complexation), and even hydrogen-bonding (among others). In light of these possibilities, "binding" can be considered to be the promotion of an increased (or intimate) level of interaction/communication between the photoactive moiety and the metal oxide surface. Although the absolute "strength" of this binding varies (based upon a number of factors including the precise mode and/or distribution of modes), the interaction is obviously greater than it would be in isolated systems (photoactive moiety and metal oxide). Binding=interaction/communication (photoactive moiety & metal oxide) which translates into some function that is a consequence of light absorption (for photoactive moieties).

The method ultimately affords a higher density of binding sites for (photo)active moieties, providing for a higher density of functional material (bound) along the metal oxide surface and enhanced binding modes. This consequence of UV treatment is absolutely independent of the photoactive moiety, although photoactive is an obvious direction considering DSCs, photo-induced changes in surface wettability (polarity) arising from photochromism (as an example) and solar-related energy (fuel) production. However, photoactive is not the only application, as there may be value in simply increasing the density of a (bound) functional material on a metal oxide surface. Consider a conductive (non-photoactive) moiety (oligomer, polymer, single molecule, particle, etc.) attached in high concentration to the metal oxide surface. Attachment may occur from the other end of the same entity to some other electrode, thereby affording essentially a "conductive wire/circuit". Certainly, there is a benefit to an increased density of "molecular circuitry". Further, a material (or materials) bound to the metal oxide surface may be simply aligned in an electric field for a useful application. A molecule (or moiety) may responds to (or can be oriented within) a magnetic field. The above-described method increases the quantity of these moieties "binding" to the surface, which is possible through the anchor on the moiety and OH groups on the metal oxide surface. Independent of this is the fact that the intrinsic properties of the moiety that is "bound", can be subsequently exploited in applications beyond light absorption capabilities.

In this section, the experimental parameters for UV-treatment ($TiO_2$) and adsorption of photosensitizer dyes on $TiO_2$ are discussed in detail. In addition, all current preliminary data for both the enhanced optical density of photosensitizers (porphyrin and ruthenium polypyridyl) adsorbed on UV-treated, transparent $TiO_2$ electrodes and functional prototype performance (N3 dye) are highlighted.

EXPERIMENTAL

General

Methanol (MeOH) used for photosensitizer adsorption was anhydrous grade (Aldrich) and was manipulated in the laboratory under normal conditions. The methanolic solutions of photosensitizer dyes for adsorption on $TiO_2$ were 0.2 millimolar (mM) in all cases. The transparent electrodes (glass plate—160 mm×80 mm×3.2 mm) printed with $TiO_2$ transparent paste (DSL 18NR-T) were obtained from DYESOL. UV-irradiation of the $TiO_2$ electrode was performed using a UVLS-28EL model lamp at 365 nm (8W, mercury source) from VWR Scientific.

Figure 5:
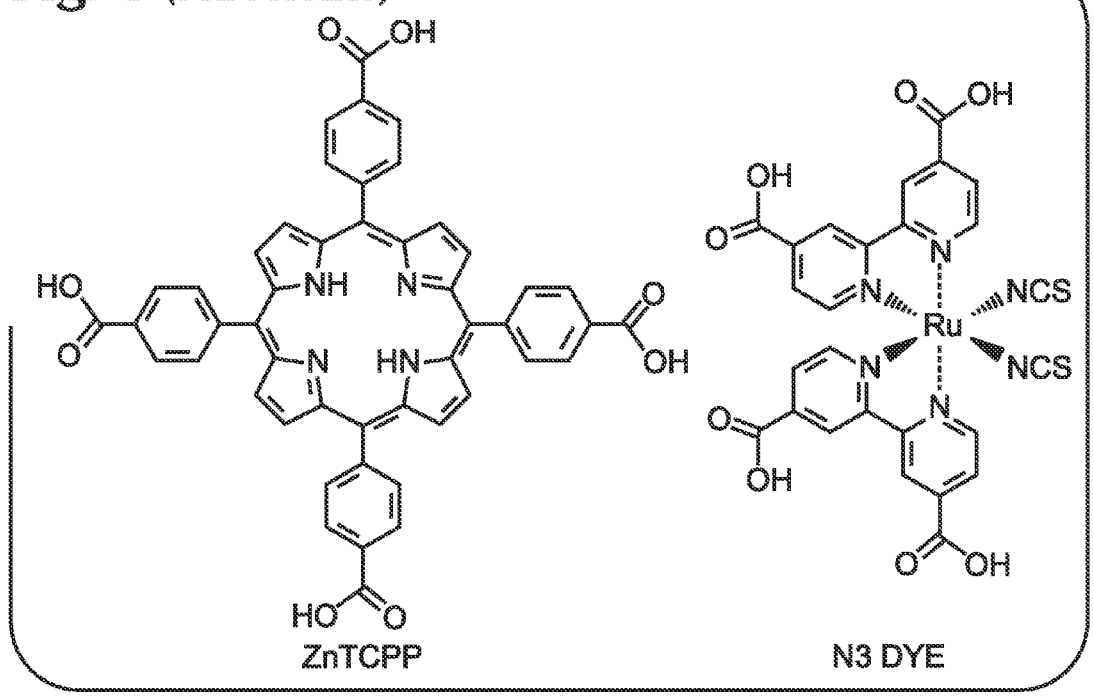
FIG. 5 is a diagram depicting ZnTCPP and N3 dye structures (prior art).

Photosensitizers:

FIG. 5 is a diagram depicting ZnTCPP and N3 dye structures (prior art). Optical density studies following UV treatment of $TiO_2$ electrodes were performed using 2 porphyrin photosensitizers [zinc meso-tetra(4-carboxyphenyl)porphyrin (ZnTCPP), $H_2$-tri-mesityl-mono(4-carboxyphenyl) porphyrin ($H_2$-Tri-mesityl-COOH)] and ruthenium polypyridyl (N3 dye). Although significant optical density enhancements from adsorbed photosensitizers following UV-treatment of $TiO_2$ were observed in all three cases, the discussion here is limited to ZnTCPP and N3 dye.

Figure 6:
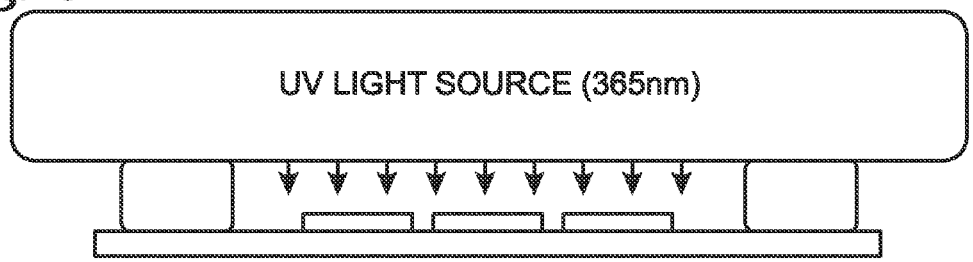
FIG. 6 is a diagram depicting an apparatus for performing UV-treatment of transparent $TiO_2$ electrodes.

UV-Treatment of $TiO_2$:

FIG. 6 is a diagram depicting an apparatus for performing UV-treatment of transparent $TiO_2$ electrodes. The light-induced hydroxylation of the $TiO_2$ surface was performed by placing transparent $TiO_2$ electrodes on a flat surface directly under a UV lamp that was fixed approximately 1 inch above the samples. Irradiation (365 nm) was carried out for either 30 or 60 minutes in a standard laboratory fume hood under ambient conditions where the relative humidity was ~37-40%. Following irradiation, the electrodes (UV-treated and control) were immediately immersed in a methanolic solution of photosensitizer (0.2 mM) for 24 h.

Figure 7:
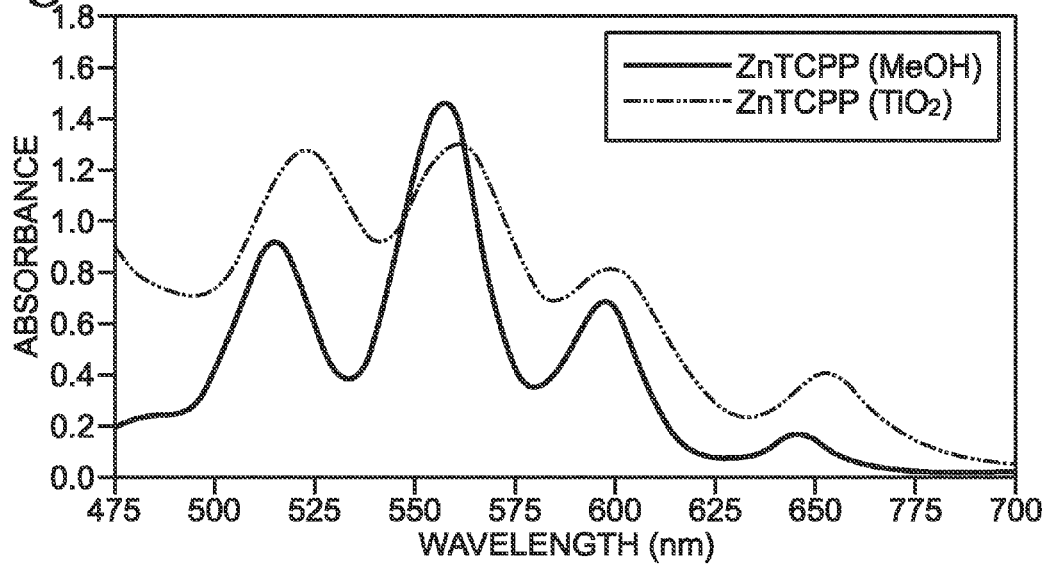
FIG. 7 is a graph depicting the optical absorbance spectra for ZnTCPP (in MeOH) and adsorbed ZnTCPP (TiO$_2$) from 475-700 nm, y-axis: absorbance in arbitrary units; x-axis: wavelength in nanometers.

Zinc meso-tetra(4-carboxyphenyl)porphyrin (ZnTCPP):

FIG. 7 is a graph depicting the optical absorbance spectra for ZnTCPP (in MeOH) and adsorbed ZnTCPP ($TiO_2$) from 475-700 nm, y-axis: absorbance in arbitrary units; x-axis: wavelength in nanometers. Absorption peaks correspond to the porphyrin Q-bands. The porphyrin Soret band is not shown due to a lack of adequate resolution arising from light-scattering below 500 nm. The absorptions at $\lambda_{max}$=514 ($Q_1$), 557($Q_2$), 597($Q_3$) and 645($Q_4$) nm correspond to the four lower energy Q-bands ($Q_1$-$Q_4$) that are characteristic of porphyrins. The optical absorption of ZnTCPP ($TiO_2$) was measured following adsorption of ZnTCPP (0.2 mM) on a transparent $TiO_2$ electrode from a methanolic solution for 24 h. Following adsorption on $TiO_2$, the spectral features of ZnTCPP are preserved and exhibit maximum absorptions for the porphyrin Q-bands for ZnTCPP ($TiO_2$) at $\lambda_{max}$=522($Q_1$), 560($Q_2$), 598($Q_3$) and 652($Q_4$) nm. The red-shifted (bathochromic) absorption for ZnTCPP ($TiO_2$) is suggestive of an increase in environmental polarity following adsorption (relative to MeOH).

Figure 8:
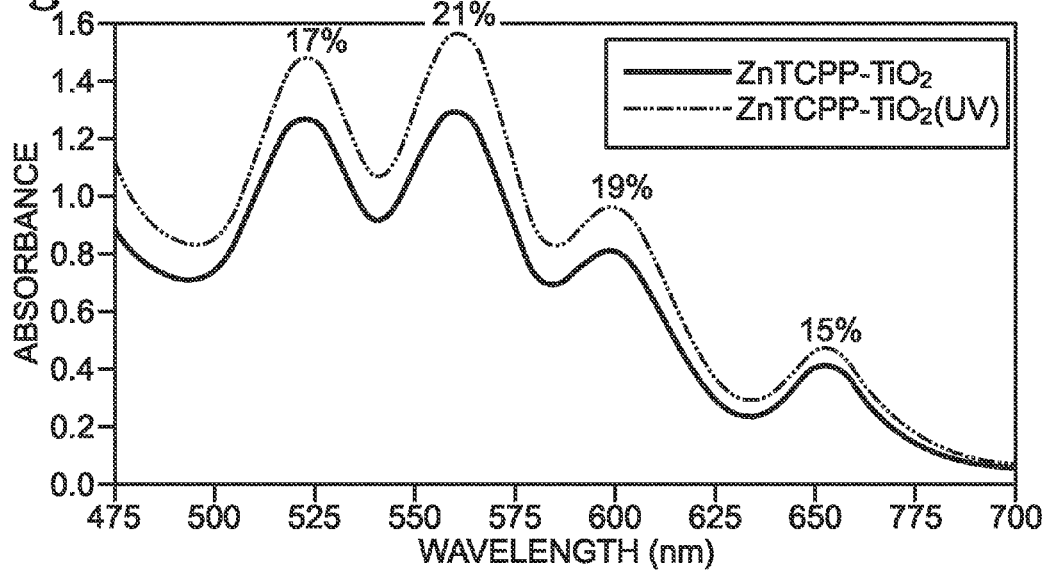
FIG. 8 is a graph depicting the optical absorbance spectra for adsorbed ZnTCPP-TiO$_2$ and ZnTCPP-TiO$_2$ (UV) following UV irradiation from 475-700 nm, y-axis: absorbance in arbitrary units; x-axis: wavelength in nanometers.

FIG. 8 is a graph depicting the optical absorbance spectra for adsorbed ZnTCPP-$TiO_2$ and ZnTCPP-$TiO_2$ (UV) following UV irradiation from 475-700 nm, y-axis: absorbance in arbitrary units; x-axis: wavelength in nanometers. Absorption peaks correspond to the porphyrin Q-bands. The porphyrin Soret band is not shown due to a lack of adequate resolution arising from light-scattering below 500 nm. The percentages indicate percent increases in absorbance for the porphyrin Q-bands for ZnTCPP adsorbed on UV-treated $TiO_2$ electrodes (60 minutes) relative to the untreated $TiO_2$ sample. ZnTCPP-$TiO_2$ was prepared by soaking a transparent $TiO_2$ electrode in a methanolic solution of ZnTCPP (0.2 mM) for 24 h followed by rinsing with methanol. For the preparation of ZnTCPP-$TiO_2$ (UV), a transparent $TiO_2$ electrode was first irradiated with UV light (365 nm) for 60 minutes prior to soaking in a methanolic solution of ZnTCPP (0.2 mM) for 24 h followed by rinsing with methanol. Although the optical spectra for both ZnTCPP-$TiO_2$ and ZnTCPP-$TiO_2$ (UV) exhibit the same absorption features, an increase in optical density is observed for ZnTCPP-$TiO_2$ (UV), which corresponds to percent increases (relative to untreated ZnTCPP-$TiO_2$) of 17% ($Q_1$), 21% ($Q_2$), 19% ($Q_3$) and 15% ($Q_4$), respectively. Based upon the differences in optical density, it is reasonable to assert that a larger number of porphyrin molecules have been successfully adsorbed following UV treatment of $TiO_2$ relative to the untreated $TiO_2$ electrode. In fact, a darker $TiO_2$ film for ZnTCPP-$TiO_2$ (UV) is perceivable with the naked eye following adsorption.

Figure 9:
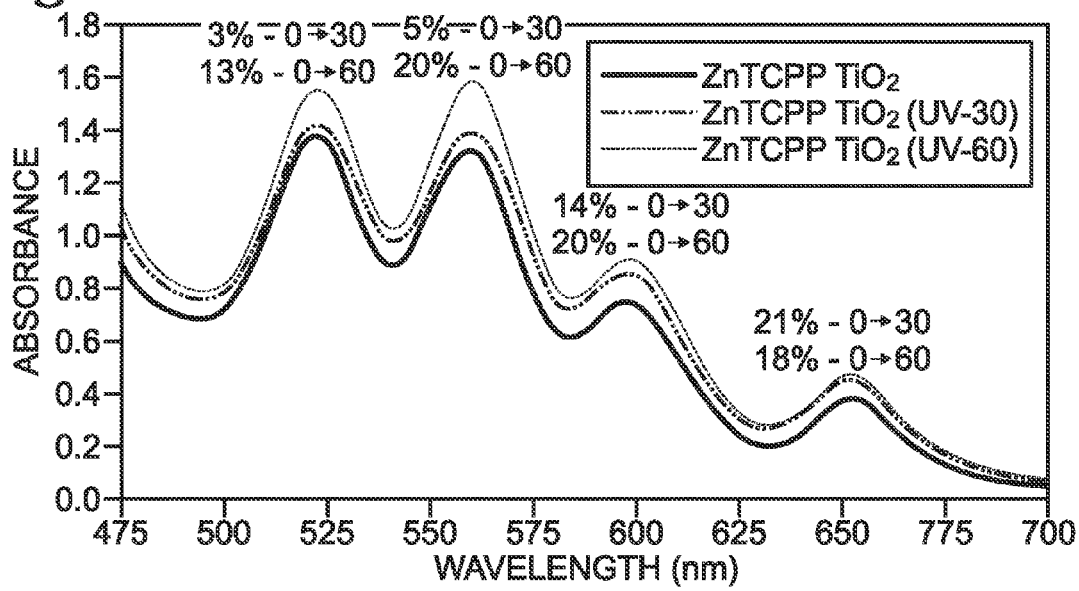
FIG. 9 is a graph depicting the optical absorbance spectra for ZnTCPP-TiO$_2$, ZnTCPP-TiO$_2$ (UV-30) and ZnTCPP-TiO$_2$ (UV-60) from 475-700 nm, y-axis: absorbance in arbitrary units; x-axis: wavelength in nanometers.

FIG. 9 is a graph depicting the optical absorbance spectra for ZnTCPP-$TiO_2$, ZnTCPP-$TiO_2$ (UV-30) and ZnTCPP- TiO$_2$ (UV-60) from 475-700 nm, y-axis: absorbance in arbitrary units; x-axis: wavelength in nanometers. Absorption peaks correspond to the porphyrin Q-bands. The porphyrin Soret band is not shown due to a lack of adequate resolution arising from light-scattering below 500 nm. The percentages indicate percent increases in absorbance for the porphyrin Q-bands for ZnTCPP adsorbed on UV-treated TiO$_2$ electrodes (30 or 60 minutes) relative to the untreated TiO$_2$ sample. To unambiguously verify the existence of increased optical density (via optical absorption measurements) for ZnTCPP on UV-treated TiO$_2$ electrodes, an additional set of experiments was carefully performed under the conditions described below. For these studies, the "strength" of porphyrin Q-Band absorption was measured as a function of UV exposure time (performed prior to ZnTCPP adsorption) at 0, 30 and 60 minutes. ZnTCPP-TiO$_2$ was prepared by soaking a transparent TiO$_2$ electrode in a methanolic solution of ZnTCPP (0.2 mM) for 24 h followed by thorough rinsing with methanol. For the preparation of ZnTCPP-TiO$_2$ (UV-30 and UV-60), transparent TiO$_2$ electrodes were irradiated with UV light (365 nm) under ambient conditions (~37% relative humidity) for either 30 or 60 minutes prior to soaking in a methanolic solution of ZnTCPP (0.2 mM) for 24 h followed by rinsing with methanol. Although the optical absorption spectrum of ZnTCPP-TiO$_2$ following UV treatment for 30 minutes shows modest percent increases of 3% ($Q_1$), 5% ($Q_2$), 14% ($Q_3$) and 21% ($Q_4$) (relative to the untreated TiO$_2$ sample), the optical densities corresponding to $Q_1$-$Q_4$ show more significant percent increases of 13% ($Q_1$), 20% ($Q_2$), 20% ($Q_3$) and 18% ($Q_4$) after a total of 60 minutes of UV exposure.

Figure 10:
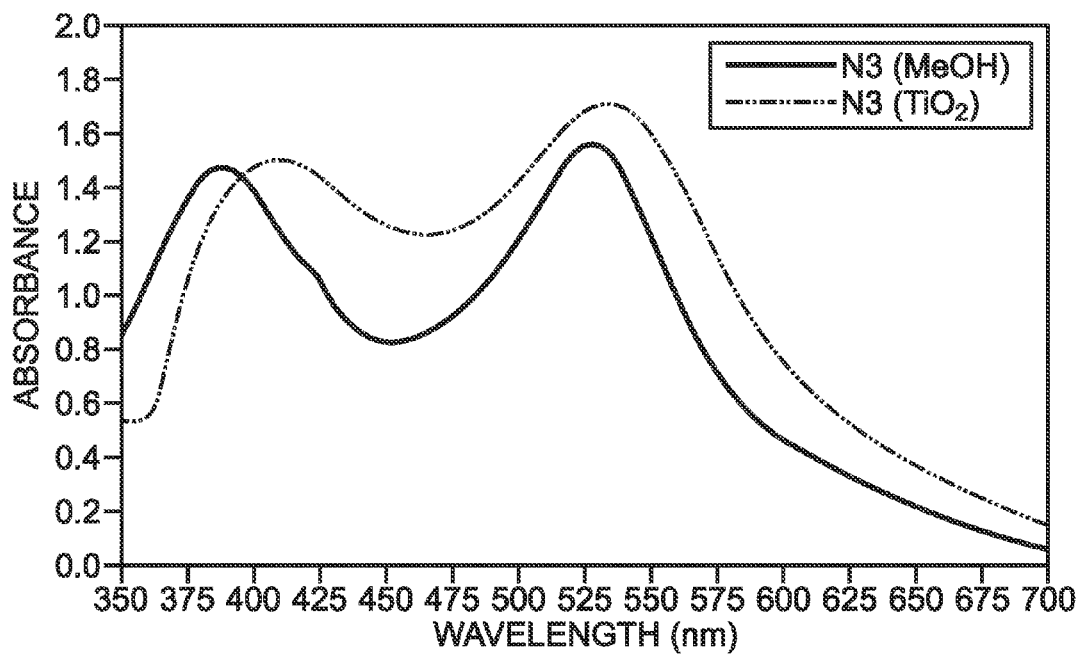
FIG. 10 is a graph depicting optical absorbance spectra for N3 dye in solution (MeOH) and adsorbed N3 dye (TiO$_2$) from 350-700 nm, y-axis: absorbance in arbitrary units; x-axis: wavelength in nanometers.

N3 Dye:

FIG. 10 is a graph depicting optical absorbance spectra for N3 dye in solution (MeOH) and adsorbed N3 dye (TiO$_2$) from 350-700 nm, y-axis: absorbance in arbitrary units; x-axis: wavelength in nanometers. The absorption features for N3 dye (in MeOH) include two maximums at $\lambda 1_{max}$=388 nm and $\lambda 2_{max}$=527 nm as well as a minimum at $\lambda_{min}$=452 nm, which corresponds to the region of decreased absorbance located between $\lambda 1_{max}$ and $\lambda 2_{max}$. The optical absorption of N3 (TiO$_2$) was measured following adsorption of N3 dye (0.2 mM) on a transparent TiO$_2$ electrode from a methanolic solution for 24 h. Following adsorption on TiO$_2$, the spectral features of N3 dye are preserved although the absorptions are red-shifted from those of N3 dye in MeOH by 22 nm ($\lambda 1_{max}$), 7 nm ($\lambda 2_{max}$) and 12 nm ($\lambda_{min}$), respectively.

Figure 11:
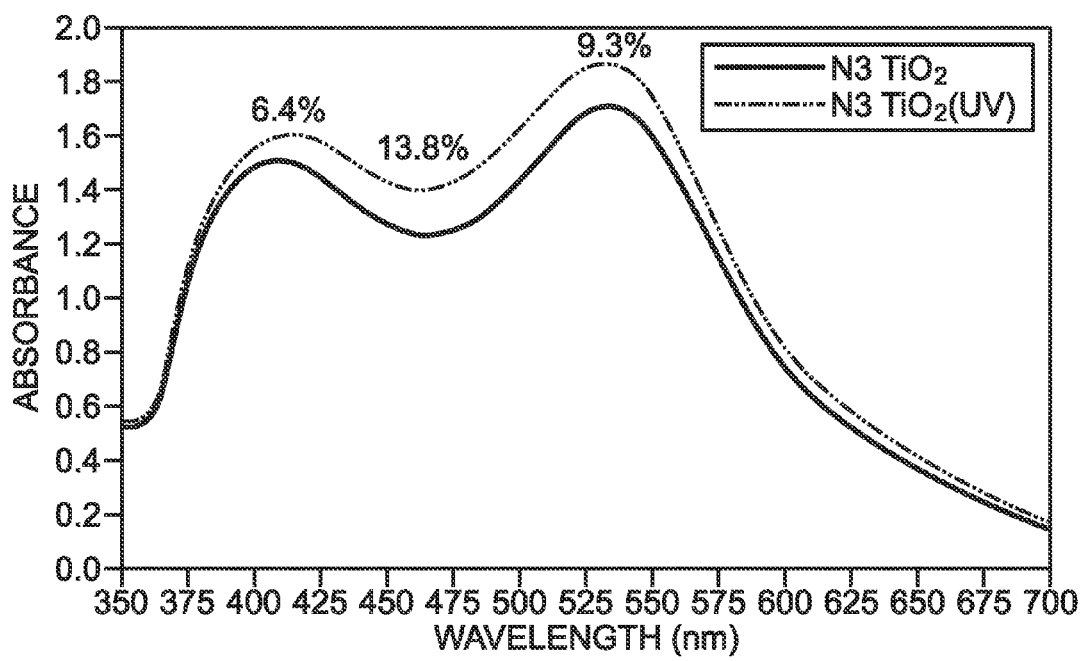
FIG. 11 is a graph depicting the optical absorbance spectra for adsorbed N3-TiO$_2$ and N3-TiO$_2$ (UV) from 350-700 nm, y-axis: absorbance in arbitrary units; x-axis: wavelength in nanometers.

FIG. 11 is a graph depicting the optical absorbance spectra for adsorbed N3-TiO$_2$ and N3-TiO$_2$(UV) from 350-700 nm, y-axis: absorbance in arbitrary units; x-axis: wavelength in nanometers. The percentages indicate percent increases in absorbance for the N3 dye adsorbed on UV-treated TiO$_2$ electrodes (60 minutes) relative to the untreated TiO$_2$ sample at $\lambda 1_{max}$ (6.4%), $\lambda 2_{max}$ (9.3%) and $\lambda_{min}$ (13.8%). N3-TiO$_2$ was prepared by soaking a transparent TiO$_2$ electrode in a methanolic solution of N3 dye (0.2 mM) for 24 h followed by rinsing with methanol. For the preparation of N3-TiO$_2$ (UV), a transparent TiO$_2$ electrode was first irradiated with UV light (365 nm) for 60 minutes prior to soaking in a methanolic solution of N3 dye (0.2 mM) for 24 h followed by rinsing with methanol. Although the optical spectra for both N3-TiO$_2$ and N3-TiO$_2$ (UV) exhibit the same major absorption features, a stronger overall absorbance is observed for N3-TiO$_2$ (UV), which corresponds to percent increases (relative to untreated N3-TiO$_2$) of 6.4% ($\lambda 1_{max}$), 9.3% ($\lambda 2_{max}$) and 13.8% ($\lambda_{min}$), respectively. Based upon the differences in absorbance strength, it is reasonable to assert that a larger number of N3 molecules have been successfully adsorbed following UV treatment of TiO$_2$ relative to the untreated TiO$_2$ electrode.

Figure 12:
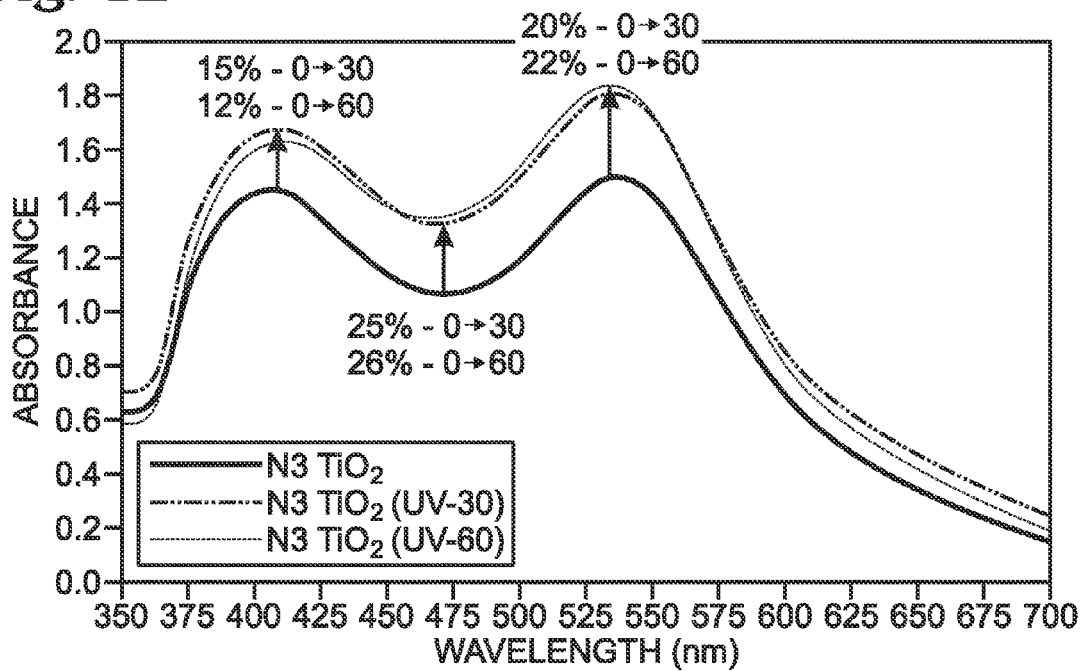
FIG. 12 is a graph depicting the optical absorbance spectra for N3-TiO$_2$, N3-TiO$_2$ (UV-30) and N3-TiO$_2$ (UV-60) from 350-700 nm, y-axis: absorbance in arbitrary units; x-axis: wavelength in nanometers.

FIG. 12 is a graph depicting the optical absorbance spectra for N3-TiO$_2$, N3-TiO$_2$ (UV-30) and N3-TiO$_2$ (UV-60) from 350-700 nm, y-axis: absorbance in arbitrary units; x-axis: wavelength in nanometers. The percentages indicate percent increases for the N3 dye adsorbed on TiO$_2$ electrodes following UV treatment for 30 and 60 minutes (versus untreated N3-TiO$_2$) at $\lambda 1_{max}$, $\lambda 2_{max}$ and $\lambda_{min}$. In order to further verify the existence of enhanced adsorption for N3 dye on UV-treated TiO$_2$ electrodes, as was similarly done in the case of ZnTCPP, an additional set of experiments was carefully performed under the conditions described below. For these studies, the optical density of adsorbed N3 was monitored as a function of UV exposure time (prior to N3 adsorption) at 0, 30 and 60 minutes (~37% ambient relative humidity). N3-TiO$_2$ was prepared by soaking a transparent TiO$_2$ electrode in a methanolic solution of N3 dye (0.2 mM) for 24 h followed by thorough rinsing with methanol. For the preparation of N3-TiO$_2$ (UV-30 and UV-60), transparent TiO$_2$ electrodes were first irradiated with UV light (365 nm) for 30 or 60 minutes under ambient conditions (~37% relative humidity) prior to soaking in a methanolic solution of N3 dye (0.2 mM) for 24 h followed by rinsing with methanol. As shown, the UV treatment of TiO$_2$ for either 30 or 60 minutes prior to N3 dye adsorption leads to significant percent increases of 12-15% ($\lambda 1_{max}$), 20-22% ($\lambda 2_{max}$) and 25-26% ($\lambda_{min}$) relative to the TiO$_2$ electrode prepared without UV treatment.

Figure 13:
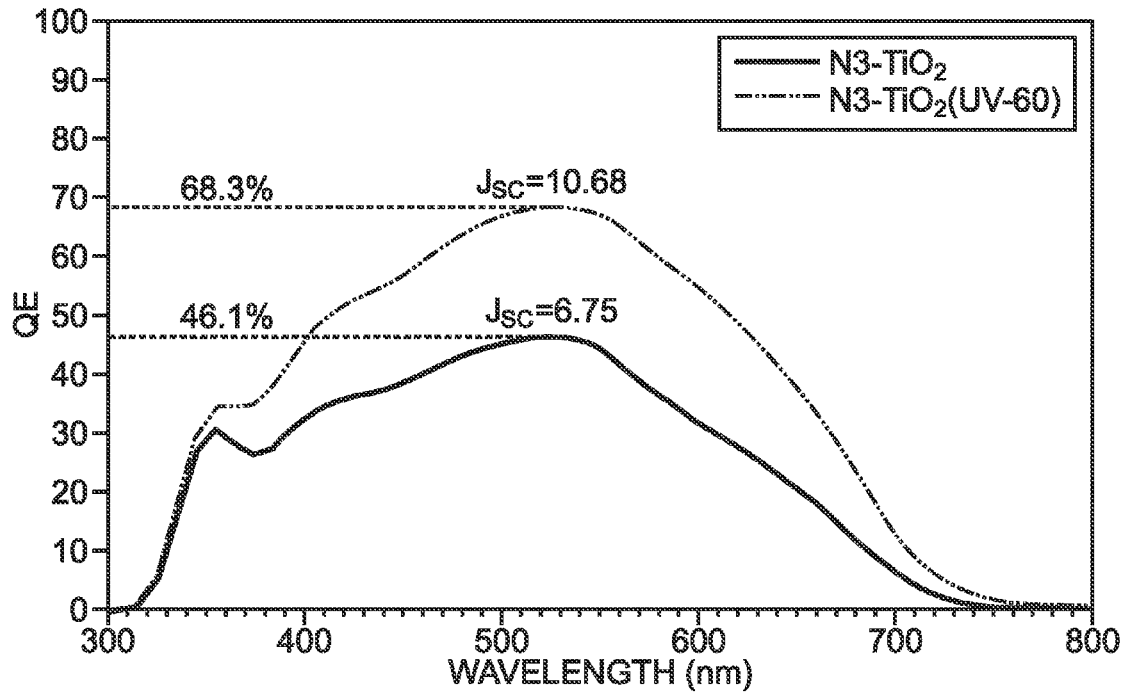
FIG. 13 is the QE spectra for N3-TiO$_2$ and N3-TiO$_2$ (UV, 60 minutes)–$QE_{max}$=46.1, $J_{sc}$=6.75 mA/cm$^2$ [N3-TiO$_2$] and $QE_{max}$=68.3%, $J_{sc}$=10.68 mA/cm$^2$ [N3-TiO$_2$ (UV-60)] [y-axis: quantum efficiency in %; x-axis: wavelength in nanometers]
Figure 14:
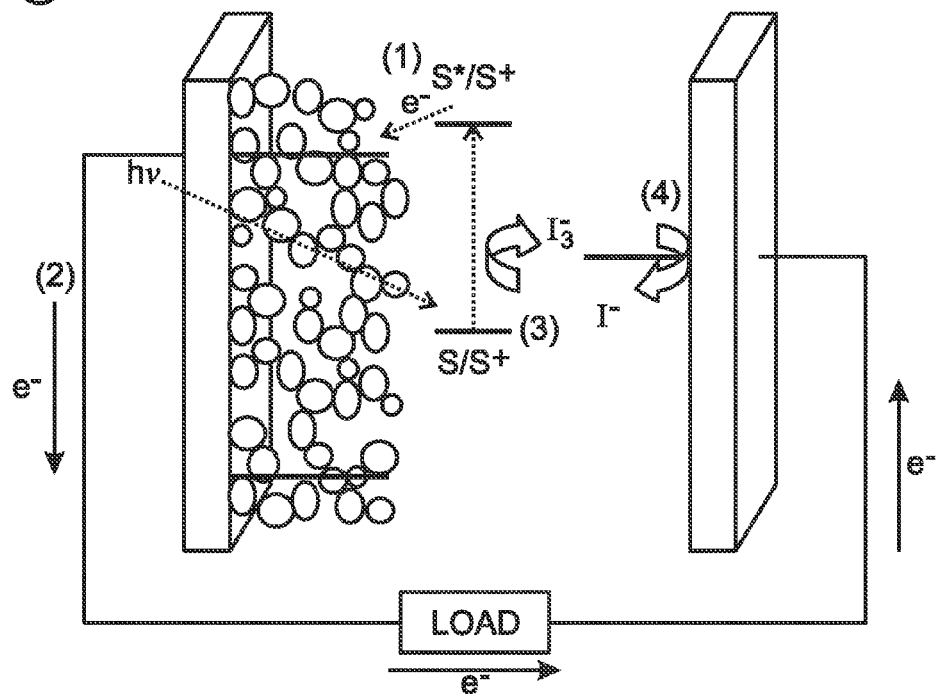
FIG. 14 is a schematic depicting the operative principles of a DSC device (prior art).

FIG. 13 is the QE spectra for N3-TiO$_2$ and N3-TiO$_2$(UV, 60 minutes)–QE$_{max}$=46.1, J$_{sc}$=6.75 mA/cm$^2$ [N3-TiO$_2$] and QE$_{max}$=68.3%, J$_{sc}$=10.68 mA/cm$^2$ [N3-TiO$_2$ (UV-60)] [y-axis: quantum efficiency in %; x-axis: wavelength in nanometers]. Functional solar cell prototypes were fabricated using both the transparent N3-TiO$_2$ and N3-TiO$_2$ (UV) electrodes whose representative absorption spectra are represented in the figure. Quantum efficiency (QE) measurements for both cells (UV-treated versus untreated) were performed from 300-800 nm in DC mode (see FIG. 11). As can be seen from the measurements, a maximum QE of 46.1% (530 nm) and J$_{sc}$ of 6.75 mA/cm$^2$ were observed for (untreated) N3-TiO$_2$. On the other hand, dramatic increases for both QE (68.3%) and J$_{sc}$ (10.68 mA/cm$^2$) were obtained for N3-TiO$_2$ (UV-60), which are attributed to enhancements arising from the UV treatment of the TiO$_2$ electrode performed prior to N3 dye adsorption. Noteworthy is the fact that the observed enhancements correspond to significant percent increases for the UV-treated TiO$_2$ sample (relative to untreated TiO$_2$ sample) in terms of both QE (+48%) and J$_{sc}$ (+58%).

In conclusion, significant increases in optical density (absorbance) were observed for UV-treated (transparent) TiO$_2$ electrodes following adsorption of either porphyrin (ZnTCPP) or N3 dye. For ZnTCPP, maximum percent increases in optical density for the UV treated electrodes of 13%, 20%, 20% and 18% were observed for the four porphyrin Q-bands following irradiation for 60 minutes prior to adsorption. In the case of N3 dye, maximum percent increases in absorbance for the UV treated electrodes of 12-15% ($\lambda 1_{max}$), 20-22% ($\lambda 2_{max}$) and 25-26% ($\lambda_{min}$) were observed following irradiation for 30 minutes (prior to adsorption). A DSC prototype fabricated using N3 dye on a UV-treated (transparent) electrode for 60 minutes yielded QE$_{max}$=68.3% and J$_{sc}$=10.68 (versus QE$_{max}$=46.1% and J$_{sc}$=6.75 mA/cm$^2$ for untreated electrode), which corresponds to significant percent increase in both QE (+48%) and J$_{sc}$ (+58%).

The increased optical densities for the adsorbed photosensitizers following UV treatment of the TiO$_2$ electrodes appear to be a consequence of enhanced adsorption phenomena arising from the intentional photo-generation of active binding sites along the TiO$_2$ surface. Although the possibility of an electronic enhancement from either generation of, or changes in the distribution of, favorable binding modes between the photosensitizers and TiO$_2$ cannot be dismissed, this appears less likely due to the similarities in absorption features for both the UV-treated and untreated samples containing adsorbed dyes. In addition, the possibility of some contribution may be considered from "photo-cleansing" of the TiO$_2$ surface during UV treatment. Due to the photocatalytic activity along the surface of TiO$_2$ films, perhaps the UV-initiated "destruction" of organic materials that would otherwise hinder photosensitizer adsorption creates additional binding sites. In any case, the dramatic enhancements are most reasonably attributed to enhanced photosensitizer adsorption through the photo-generation of active binding sites, some level of catalytic "photocleansing", or perhaps both.

Finally, the extension of this technology/invention is applicable to various additional nanostructured TiO$_2$ (electrode) architectures including nanoparticle films (transparent, opaque, multi-layer, etc.), mesoporous nanoparticle films, mixed nanoparticle films, nanowires, nanopillars, nanotubes, etc.

A method has been provided for the UV treatment of metal oxide electrodes. Examples of particular photoactive moieties have been presented to illustrate the invention. However, the invention is not limited to merely these examples. Other variations and embodiments of the invention will occur to those skilled in the art.

We claim:

1. An ultraviolet treatment method for a metal oxide electrode, the method comprising:
   providing a metal oxide electrode;
   supplying a humid environment;
   in the humid environment, exposing the metal oxide electrode surface to an ultraviolet (UV) light source;
   subsequent to exposing the metal oxide electrode to the UV light source in the humid environment, treating the metal oxide electrode with a photosensitizer dye having at least one anchor group, where the anchor group is a chemical group capable of promoting communication between the photosensitizer dye and the metal oxide electrode; and,
   binding the photosensitizer dye to a surface of the metal oxide electrode via the anchor group.

2. The method of claim 1 further comprising:
   subsequent to binding the photosensitizer dye to the metal oxide electrode, exposing the photosensitizer dye to light; and,
   initiating a photoexcited state in the photosensitizer dye from which a process occurs selected from a group consisting of electron injection, electron transfer, multi-electron transfer, energy-transfer, oxidation, reduction, free radical generation, complex formation, complex dissociation, ligand exchange, conformational change, isomerization, generation of subsequent excited-states, modes of deactivation for an excited-state of the photosensitizer dye and combinations of the above-listed processes.

3. The method of claim 1 wherein exposing the metal oxide electrode to the UV light source in the humid environment includes
   inducing hydroxylation of the metal oxide electrode surface; and,
   wherein binding the photosensitizer dye to the surface of the metal oxide electrode includes binding at least one anchor group of the photosensitizer dye to a hydroxyl group on the surface of the metal oxide electrode.

4. The method of claim 3 wherein inducing hydroxylation on the surface of the metal oxide electrode in response to the UV light source and humid environment includes generating a larger population of hydroxyl groups on the surface of the metal oxide electrode relative to a control sample not exposed to the UV light source and humid environment.

5. The method of claim 3 further comprising:
   generating an interaction between the metal oxide electrode surface and the photosensitizer dye in response to a binding between an anchor group of the photosensitizer dye and hydroxyl groups on the surface of the metal oxide electrode.

6. The method of claim 1 wherein supplying the humid environment includes supplying an environment with a humidity level of at least 30%.

7. The method of claim 1 wherein providing the metal oxide electrode includes providing a metal oxide electrode selected from a group consisting of metal and mixed-metal oxides of titanium, silicon, magnesium, calcium, strontium, barium, scandium, yttrium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, zinc, cadmium, mercury, aluminum, gallium, indium, germanium, tin, lead, antimony, and bismuth.

8. The method of claim 7 wherein providing the metal oxide electrode includes providing a metal oxide electrode with a morphology selected from a group consisting of amorphous, crystalline, and representative of both amorphous and crystalline.

9. The method of claim 7 wherein providing the metal oxide electrode includes providing a metal oxide electrode with an architecture selected from a group consisting of planar, particles, nanoparticles, wires, nanowires, tubes, nanotubes, cones, nanocones, rods, nanorods, pillars, nanopillars, mesoporous, geometric shapes in two-dimensional (2D) and 3D arrays, and combinations thereof.

10. The method of claim 7 wherein providing the metal oxide electrode includes providing a metal oxide electrode blended with a conducting species selected from a group consisting of carbon, grapliene, carbon nanotubes, fullerenes, and combinations thereof.

11. The method of claim 1 wherein treating the metal oxide electrode with the photosensitizes includes treating with a photosensitizer dye selected from a group consisting of organic, inorganic, metallic, and combinations thereof including monomers, oligomers, polymers, macromolecular complexes, quantum dots, and inorganic/metallic nanoparticles.

12. The method of claim 1 wherein treating the metal oxide electrode with the photosensitizer dye includes treating with a photosensitizer dye combined with a separate non-photoactive material;
   the method further comprising:
   subsequent to binding the photosensitizer dye to the metal oxide electrode, exposing the photosensitizer dye to light; and,
   in response to absorbing the light, initiating a photoexcited state in the photosensitizer dye in the presence of the non-photoactive material.

13. The method of claim 1 wherein exposing the metal oxide electrode to the UV light source includes exposing the metal oxide electrode to a UV light source with a wavelength in a range between 350 and 385 nanometers (nm).

14. The method of claim 1 wherein treating the metal oxide electrode with the photosensitizer dye includes simultaneously treating the metal oxide electrode with a plurality of photosensitizer dyes.

15. The method of claim 1 wherein treating the metal oxide electrode with the photosensitizer dye includes sequentially treating the metal oxide electrode with a plurality of photosensitizer dyes.

16. The method of claim 1 wherein treating the metal oxide electrode with the photosensitizer dye having at least one anchor group includes an anchor group selected from a collection consisting of carboxylic acids, carboxylate salts, phosphonic acids, phosphonate salts, sulfonic acids, sulfonate salts, silanes, and combinations thereof.

17. An ultraviolet treatment method for a metal oxide electrode, the method comprising:
   providing a metal oxide electrode;
   supplying a humid environment;
   in the humid environment, exposing the metal oxide electrode surface to an ultraviolet (UV) light source;
   inducing hydroxylation of the metal oxide electrode surface;
   subsequent to exposing the metal oxide electrode to the IJV light source in the humid environment, treating the metal oxide electrode with a photosensitizer dye having at least one anchor group, where the anchor group is a chemical group capable of promoting communication between the photosensitizer dye and the metal oxide electrode; and,
   binding the photosensitizer dye to hydroxyl groups on a surface of the metal oxide electrode via the anchor group.

* * * * *

UNITED STATES PATENT AND TRADEMARK OFFICE
CERTIFICATE OF CORRECTION

| | | |
|---|---|---|
| PATENT NO. | : 9,082,700 B2 | Page 1 of 1 |
| APPLICATION NO. | : 13/296191 | |
| DATED | : July 14, 2015 | |
| INVENTOR(S) | : Sean Vail et al. | |

It is certified that error appears in the above-identified patent and that said Letters Patent is hereby corrected as shown below:

In the Claims

In Column 14, at line 44, claim 10, the word "graphene" has been incorrectly printed as "grapliene".

Signed and Sealed this
Third Day of November, 2015

Michelle K. Lee
*Director of the United States Patent and Trademark Office*